United States Patent
Kothandaraman et al.

(10) Patent No.: US 7,242,072 B2
(45) Date of Patent: Jul. 10, 2007

(54) ELECTRICALLY PROGRAMMABLE FUSE FOR SILICON-ON-INSULATOR (SOI) TECHNOLOGY

(75) Inventors: Chandrasekharan Kothandaraman, Hopewell Junction, NY (US); Edward P. Maciejewski, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/904,681

(22) Filed: Nov. 23, 2004

(65) Prior Publication Data

US 2006/0108662 A1 May 25, 2006

(51) Int. Cl.
*H01L 29/06* (2006.01)

(52) U.S. Cl. .................. 257/529; 257/665; 257/538; 257/209; 257/E23.149; 438/132; 438/215; 438/281; 438/333; 438/467

(58) Field of Classification Search ........ 257/E23.149, 257/209, 347, 379, 529, 528, 665, 50
See application file for complete search history.

(56) References Cited

U.S. PATENT DOCUMENTS

| | | | |
|---|---|---|---|
| 5,444,287 A | 8/1995 | Bezama et al. | |
| 5,585,663 A | 12/1996 | Bezama et al. | |
| 5,851,903 A | 12/1998 | Stamper | |
| 5,969,404 A | 10/1999 | Bohr et al. | |
| 6,150,916 A * | 11/2000 | Lin et al. | 337/297 |
| 6,222,244 B1 | 4/2001 | Arndt et al. | |
| 6,323,535 B1 | 11/2001 | Lyer et al. | |
| 6,337,507 B1 | 1/2002 | Bohr et al. | |
| 6,388,305 B1 | 5/2002 | Bertin et al. | |
| 6,396,121 B1 | 5/2002 | Bertin et al. | |
| 6,432,760 B1 * | 8/2002 | Kothandaraman et al. | 438/215 |
| 6,433,404 B1 | 8/2002 | Lyer et al. | |
| 6,509,236 B1 | 1/2003 | Aipperspach et al. | |
| 6,515,510 B2 | 2/2003 | Noble et al. | |
| 6,583,490 B2 | 6/2003 | Hagiwara et al. | |
| 6,596,592 B2 | 7/2003 | Bertin et al. | |
| 6,624,499 B2 | 9/2003 | Kothandaraman et al. | |
| 6,642,601 B2 | 11/2003 | Marshall et al. | |
| 6,933,591 B1 * | 8/2005 | Sidhu et al. | 257/665 |
| 2002/0113291 A1 * | 8/2002 | Adkisson et al. | 257/529 |
| 2002/0135043 A1 * | 9/2002 | McDevitt et al. | 257/529 |
| 2004/0004268 A1 | 1/2004 | Brown et al. | |
| 2005/0214982 A1 * | 9/2005 | Wu | 438/149 |

FOREIGN PATENT DOCUMENTS

WO WO2004/100271 11/2004

* cited by examiner

*Primary Examiner*—Jerome Jackson
*Assistant Examiner*—Paul Budd
(74) *Attorney, Agent, or Firm*—Todd M. C. Li

(57) ABSTRACT

A fuse structure and method of forming the same is described, wherein the body of the fuse is formed from a crystalline semiconductor body on an insulator, preferably of a silicon-on-insulator wafer, surrounded by a fill-in dielectric. The fill-in dielectric is preferably a material that minimizes stresses on the crystalline body, such as an oxide. The body may be doped, and may also include a silicide layer on the upper surface. This fuse structure may be successfully programmed over a wide range of programming voltages and time.

16 Claims, 11 Drawing Sheets

ELECTRICALLY PROGRAMMABLE FUSE FOR SILICON-ON-INSULATOR (SOI) TECHNOLOGY

BACKGROUND OF THE INVENTION

1. Technical Field of the Invention

The invention relates generally to the field of integrated circuits and, more particularly, to fusible link programming in SOI technology.

2. Description of Related Art

In integrated circuits including CMOS integrated circuits, it is often desirable to be able to permanently store information, or to form permanent connections of the integrated circuit after it is manufactured. Fuses or devices forming fusible links are frequently used for this purpose. Fuses can also be used to program redundant elements to replace identical defective elements, for example. Further, fuses can be used to store die identification or other such information, or to adjust the speed of a circuit by adjusting the resistance of the current path.

One type of fuse device is "programmed" or "blown" using a laser to open a link after a semiconductor device is processed and passivated. This type of fuse device requires precise alignment of the laser on the fuse device to avoid destroying neighboring devices. This and other similar approaches can result in damage to the device passivation layer, and thus, lead to reliability concerns. For example, the process of blowing the fuse can cause a hole in the passivation layer when the fuse material is displaced.

Another type of fuse device 30, illustrated in plan view in FIG. 1A and cross-section view in FIG. 1B through line A–A', and cross-section view in FIG. 1C through line B–B', is based on rupture or agglomeration or electromigration of silicided polysilicon. These type of fuses include a silicide layer 20 disposed on a polysilicon layer 18, overlain by a layer of silicon nitride 24. Contacts 25 are coupled to the silicide layer 20 in a pair of contact regions 22 on either side of a fuse element 27 to provide an electrical connection between the fuse and external components for programming and sensing. FIG. 1A illustrates a top view of the typical shape and includes the fuse element 27 and contact regions 22. FIG. 1B shows a side view of a typical fuse construction in which the polysilicon layer 18 and the silicide layer 20 are provided at a uniform thickness disposed on an oxide layer 10 also of a uniform thickness, and FIG. 1C illustrates a cross-section through the fuse link region 27. Generally, a blanket nitride capping layer 24 is also provided over layers 20 and 22.

The silicide layer 20 has a first resistance and the polysilicon layer 18 has a second resistance which is greater than the first resistance. In an intact condition, the fuse link has a resistance determined by the resistance of the silicide layer 20. In common applications, when a programming potential is applied, providing a requisite current and voltage over time, across the fuse element 27 via the contact regions 22, the silicide layer 20 begins to randomly "ball-up" eventually causing an electrical discontinuity or rupture in some part of the silicide layer 20. Thus, the fuse link 27 has a resultant resistance determined by that of the polysilicon layer 18 (i.e. the programmed fuse resistance is increased to that of the second resistance). However, this type of fuse device can result in damage to surrounding structure and/or suffers from unreliable sensing because of the inconsistent nature of the rupture process and the relatively small change typically offered in the programmed resistance. Further, these type of devices may not be viable for use with many of the latest process technologies because of the required programming potentials, i.e. current flow and voltage levels over a requisite amount of time.

In another type of fuse, the electromigration fuse, a potential is applied across the conductive fuse link via the cathode and anode in which the potential is of a magnitude and direction to initiate electromigration of silicide from a region of the semiconductor fuse reducing the conductivity of the fuse link. The electromigration is enhanced by commencing a temperature gradient between the fuse link and the cathode responsive to the applied potential. Even with this type of fuse, the programming of the fuse is still dominated by the polysilicon material. Since the polysilicon film contains a significant number of imperfections the final resistance has a wide distribution. This sometime results in a programmed fuse from being sensed incorrectly leading to the failure of the chip.

Therefore, a need exists for a programming method and apparatus which reduces the variability of programming inherent in fuses formed on polysilicon. Furthermore it is desirable to reduce the energy required to program the fuse. It is also preferable to have a significant difference in resistance between the programmed and the un-programmed state. Also, there is a need to shrink the area occupied by the support circuitry.

SUMMARY OF THE INVENTION

The present invention is directed to an electrically programmable fuse comprising a semiconductor substrate, an insulating layer on the semiconductor substrate, and a crystalline semiconductor body disposed on the insulating layer, so that the crystalline semiconductor body is electrically and thermally isolated from the semiconductor substrate, and the crystalline body comprising a fuse link region electrically connected to a first contact region at a first end of the fuse link region and a second contact region at the opposing end of the fuse link region. The present fuse is particularly suited for silicon-on-insulator technology. The crystalline body may be formed from crystalline silicon, doped crystalline Si, crystalline SiGe, doped crystalline SiGe, crystalline GaAs, or doped crystalline GaAs, and the like. The insulating layer may be a dielectric such as an oxide or nitride.

In another aspect of the invention, a layer of polycide or salicide may be formed on the surface of the crystalline body. The crystalline body may be doped or undoped, depending on the desired conductivity of the fuse.

In yet another aspect of the invention, the sidewalls of the crystalline semiconductor body are substantially surrounded by a fill-in dielectric. The fill-in dielectric preferably does not substantially impose additional stress on said crystalline semiconductor body. The fill-in dielectric also preferably minimizes outdiffusion of dopants from the crystalline semiconductor body. Preferably the fill-in dielectric is an oxide.

The present invention has the advantage that it can be successfully programmed over a wide range of programming voltages and time. The structure automatically provides the temperature gradient required for successful programming without special control effort. The voltage, current and time needed to program the inventive fuse are small, which results in significant savings in area. The uniformity of the crystalline body improves consistency of such fuses across the chip.

BRIEF DESCRIPTION OF THE DRAWINGS

For a more complete understanding of the present invention, reference is made to the following detailed description taken in conjunction with the accompanying drawings, which are not necessarily drawn to scale, wherein.

DETAILED DESCRIPTION

Figure 1B:
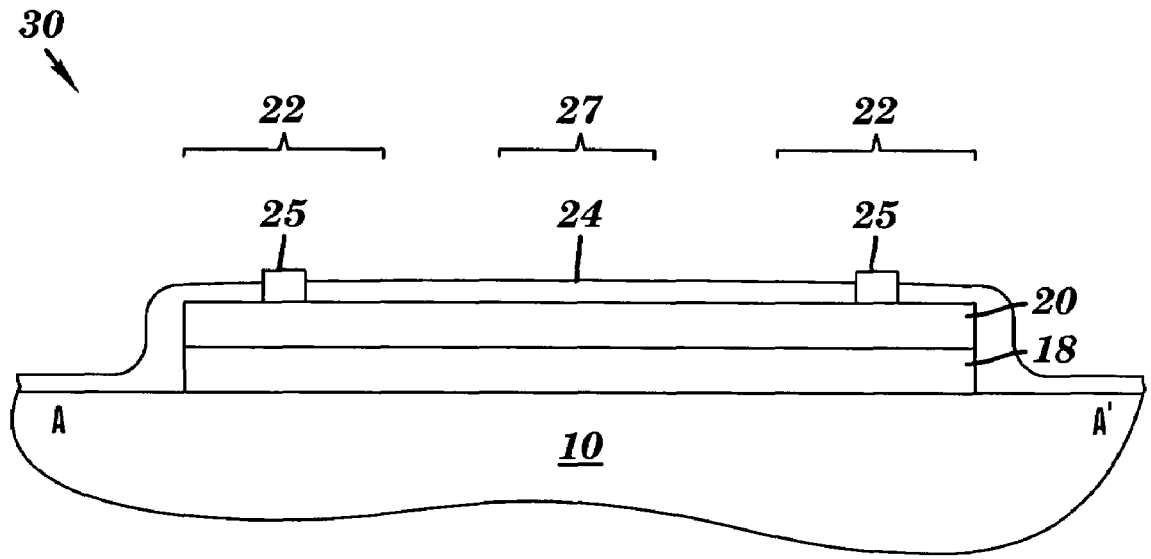
FIG. 1B illustrates a cross-section view of a conventional fusible link device.
Figure 1A:
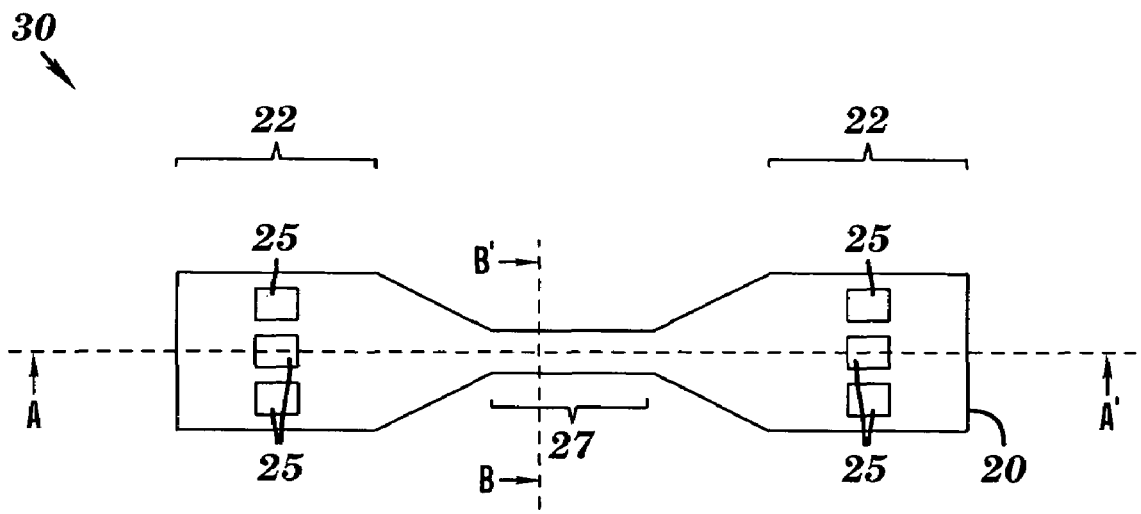
FIG. 1A illustrates a plan view of a conventional fusible link device.
Figure 1C:
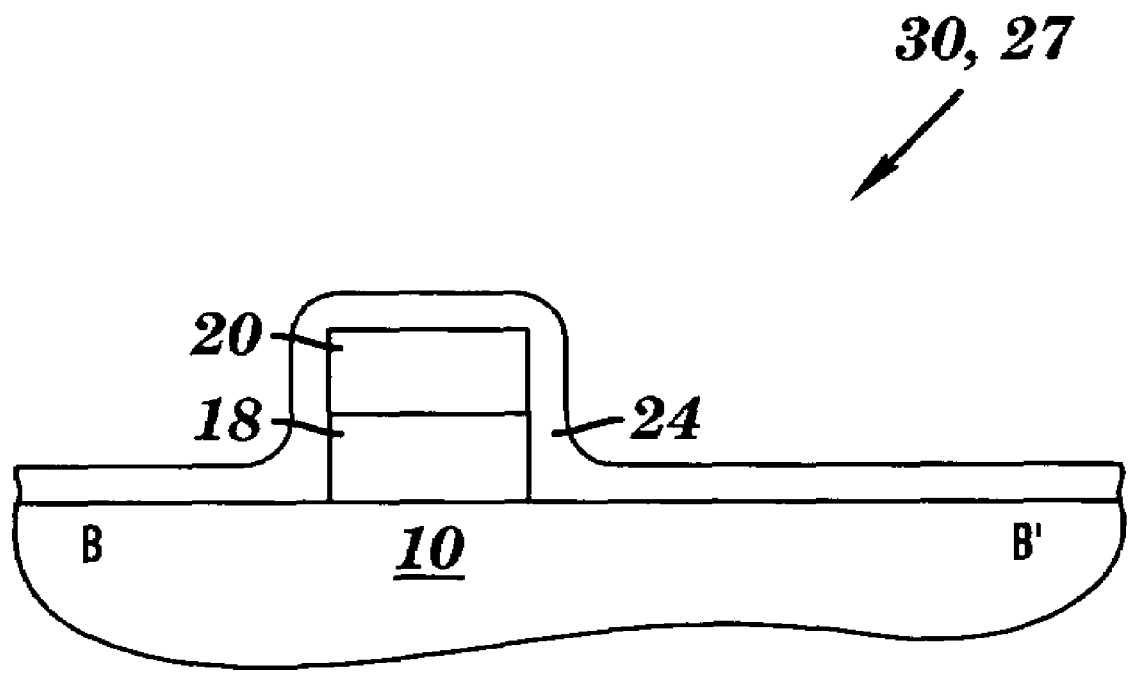
FIG. 1C illustrates a cross-section view of a conventional fusible link device.

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others. Throughout the drawings, it is noted that the same reference numerals or letters will be used to designate like or equivalent elements having the same function. Detailed descriptions of known functions and constructions unnecessarily obscuring the subject matter of the present invention have been omitted for clarity. The drawings are provided to aid in understanding the present invention, and are not necessarily drawn to scale.

Figure 2A:
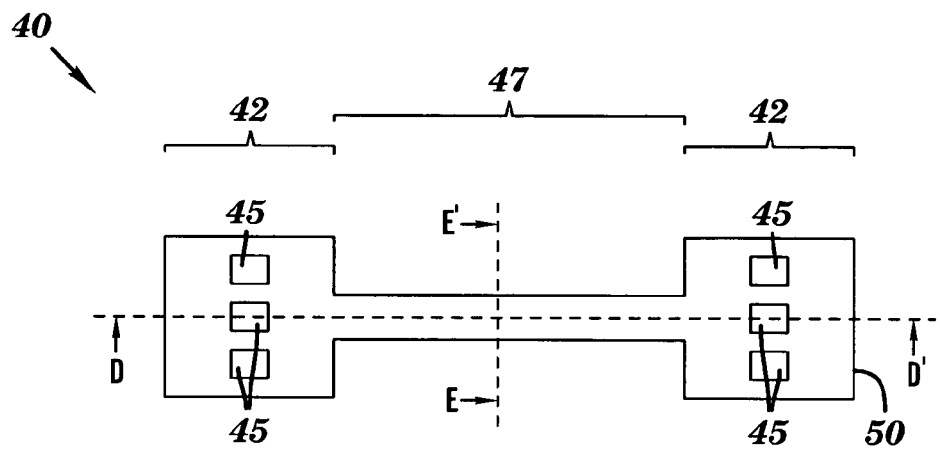
FIG. 2A illustrates a plan view of an embodiment of the inventive fuse.

FIG. 2A illustrates a plan view of an embodiment of an electrically programmable fuse 40 (hereinafter referred to as an eFUSE), in accordance with the present invention. The inventive eFUSE includes two contact regions 42 connected by a fuse link 47. The contact regions 42 include at least one contact 45. If desired, more than one contact 45 may be formed in the contact region 42, thus the contact region 42 may be made wider than the fuse link region 47, as illustrated in FIG. 2A.

Figure 2B:
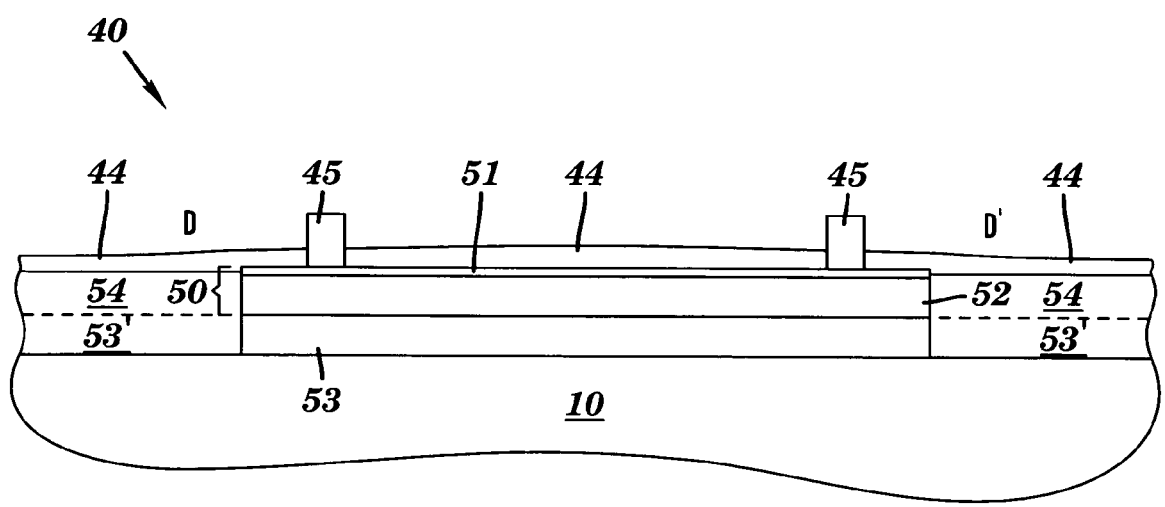
FIG. 2B illustrates a cross-section view of an embodiment of the inventive fuse.
Figure 2C:
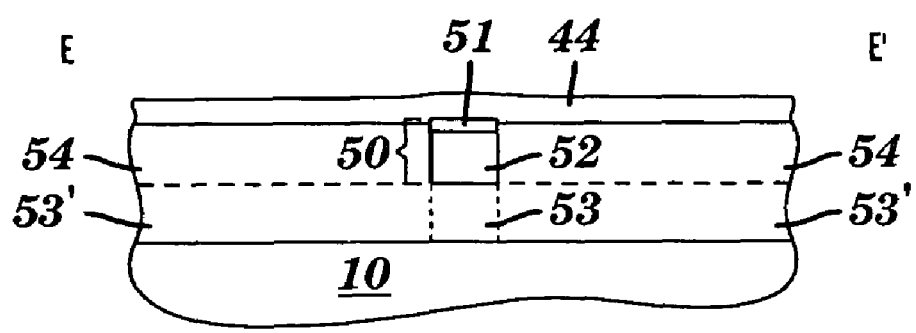
FIG. 2C illustrates a cross-section view of an embodiment of the inventive fuse.

Referring to the cross-section view along line D–D' in FIG. 2B, the inventive eFUSE structure includes a conductive layer 50 disposed atop an insulator 53, which electrically and thermally isolates the conductive layer 50 from the wafer substrate 10. The conductive layer includes a crystalline semiconductor body 52, optionally having an upper region 51 that is more conductive than the body 52 of the crystalline semiconductor layer 50. For example, the body of the fuse link 50 may be a crystalline silicon film or any conductive crystalline semiconductor such as SiGe, GaAs and the like. If the body 50 of the crystalline semiconductor does not have sufficient conductivity, i.e. if the sheet resistance of the body 50 is $>100\Omega/\square$, then the upper region 51 of the fuse link 47 may be made more conductive than the body 50 of the crystalline semiconductor, for example, the upper region 51 may comprise a silicide. Alternatively, the body 50 may be made sufficienttly conductive, for example by including a dopant, such as B, As, P or In. Alternatively, the fuse link 50 may comprise a combination of a doped crystalline body 52 and a conductive upper region 51, such as silicide. Preferably, the sheet resistance of the body 50 is less than $100\Omega/\square$. The insulator 53 may be an oxide, such as silicon dioxide or a nitride, such as silicon nitride. The insulating layer 53 preferably extended along the surface of the substrate 10, as indicated by insulating layer 53'. For example, the eFUSE of the present invention may formed on a silicon-on-insulator (SOI) wafer, wherein a silicon substrate 10 is overlain by a buried oxide (BOX) layer 53/53'. The conductive layer 50 of the eFUSE 40 is further surrounded by a fill-in dielectric material 54. The fill-in dielectric is preferably chosen so as to minimize stress on the fuse body 52 or fuse link 50, and preferably limits outdiffusion of dopants from the fuse 40. The fill-in dielectric 54 is preferably an oxide which may be the same or different oxide as the insulating layer 53 or 53'. As indicated in cross-section through the fuse link region 47 along line E–E' illustrated in FIG. 2C, the fuse link 50 is covered by the nitride layer 44, but the sidewalls of the fuse link are preferably not surrounded by nitride but rather by an oxide 54, due to the quality of the interface of the dielectric to the semiconductor body 50.

For a typical SOI wafer, having a silicon substrate of thickness on the order of about 300 µm, and buried oxide layer 53/53' of thickness in the range 100–300 nm, the crystalline layer 52 preferably has a thickness in the range 50–100 nm. The upper conductive layer 51 is preferably about 10–20 nm thick. The nitride capping layer is typically 30–100 nm thick, more typically about 50 nm. The length of the eFUSE 40 may be in the range 0.5–1.5 µm, and the width in the range 0.03–0.3 µm, although this will depend on the design and lithographic ground rules. The contact region 42 and the fuse link region 47 may have widths that are about the same, or the contact region 42 may be wider than the fuse link region 47, typically based on the number of contacts 45 desired. Preferably, the fuse link 47 has a width equal to or less than about 0.12 µm.

In the un-programmed state the electrical resistance of the fuse link 50 is comprised of the individual resistances of the crystalline semiconductor film 52 and the upper conductive (e.g. silicide or doped crystalline semiconductor) layer 51 combined in parallel. In an embodiment of this structure comprising a conductive silicide layer 51 and a crystalline silicon body 52 provides an initial resistance is typically less than about 100 Ω, less than what can be obtained with prior-art fuses of comparable dimensions (typically about 200 Ω). Then a potential is applied across the conductive fuse link 47 via the contacts 45 resulting in the dissipation of energy on the fuse-link 47. The energy dissipation on the fuse-link 47 increases the resistance of the fuse-link. Since a crystalline semiconductor layer such as crystalline silicon is devoid of defects such as grain boundaries (which are typically present in polysilicon films used in prior art fuses), the programming is achieved very effectively. This makes the eFUSE of the present invention very energy efficient, thus requiring smaller area for support circuitry. Moreover the final resistance achieved is very high and is uniform.

This eFUSE structure 40 also enables very easy achievement of a high and uniform final resistance, thus avoiding avoids deleterious effects such as rupture or agglomeration and avoiding collateral damage to adjacent devices. The inventive fuse structure 40 thus advantageously permits lower programming voltage/current and/or programming time. Since the eFUSE structure 40 can be formed using standard CMOS technology, without any additional masking or processing steps.

Figure 3:
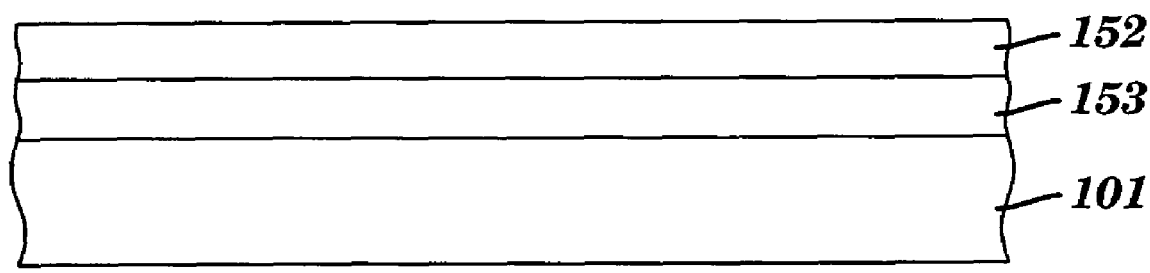
FIG. 3 illustrates a cross-section of an embodiment of the inventive fuse during the formation of the fuse.

The following discussion, and the accompanying figures, describes a preferred embodiment for forming the inventive eFUSE structure. Referring to FIG. 3, a SOI wafer is provide comprising a crystalline semiconductor layer 152 on an insulating layer 153, which in turn is disposed atop a semiconductor substrate 101, which need not be crystalline. In a typical SOI wafer, the semiconductor is typically silicon, but any suitable semiconductor material, such as SiGe, GaAs, InP and the like may be used. An SOI wafer having a crystalline silicon layer 152 may be formed, for example, by starting with a crystalline silicon wafer, then implanting oxygen ions, for example, to a depth between about 100 nm to 500 nm. The implanted SOI wafer is then annealed, which results in a thin layer of silicon dioxide 153 under a thin crystalline silicon layer 152. Alternatively, the structure illustrated in FIG. 3 may be formed by forming an oxide layer on a first silicon wafer and an oxide layer on a second silicon wafer, wherein at least one of the silicon wafers consists of crystalline silicon, and then bonding the two wafers along the corresponding oxide layers, so as to form the structure of FIG. 3. Note that any orientation for the crystalline semiconductor may be used, but orientations of <100> or <110> would typically be used. It should be emphasized that the crystalline silicon layer 152 is electrically and thermally isolated from the silicon substrate 101.

Figure 4A:
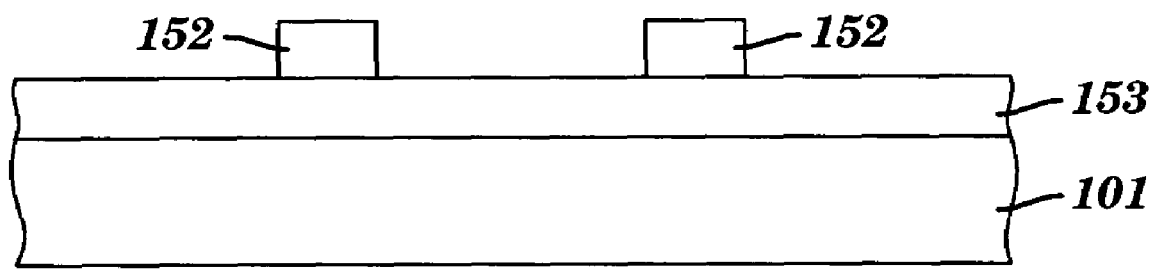
FIG. 4A illustrates a cross-section of an embodiment of the inventive fuse during the formation of the fuse.
Figure 4B:
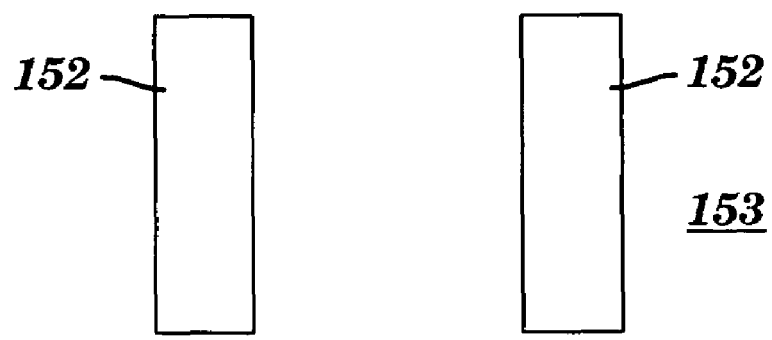
FIG. 4B illustrates a plan view of an embodiment of the inventive fuse during the formation of the fuse.

Next, the crystalline silicon layer 152 is patterned using standard lithographic techniques to obtain regions of crystalline silicon 152 that will ultimately form of eFUSE. FIG. 4A illustrates a cross-section view of the patterned crystalline silicon 152 and FIG. 4B illustrates a plan view of the patterned crystalline silicon features 152.

Figure 5A:
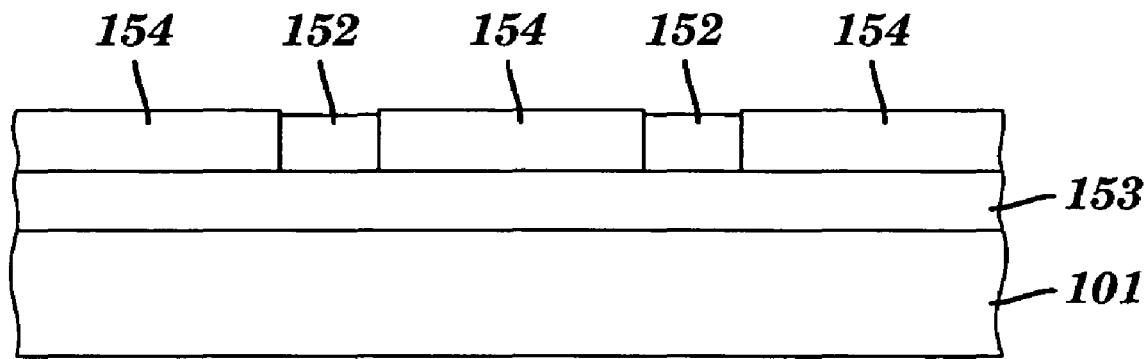
FIG. 5A illustrates a cross-section of an embodiment of the inventive fuse during the formation of the fuse.
Figure 5B:
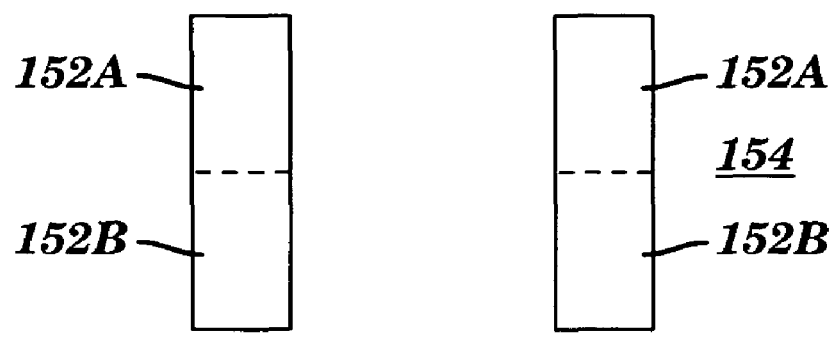
FIG. 5B illustrates a plan view of an embodiment of the inventive fuse during the formation of the fuse.

Next, a dielectric material 154, such as silicon dioxide is deposited over the entire surface and then planarized using standard techniques, such as chemical-mechanical polishing (CMP), to fill in the gaps between the crystalline silicon regions 152. A cross-section view of the structure is illustrated in FIG. 5A, and the corresponding plan view is illustrated in FIG. 5B.

Figure 6A:
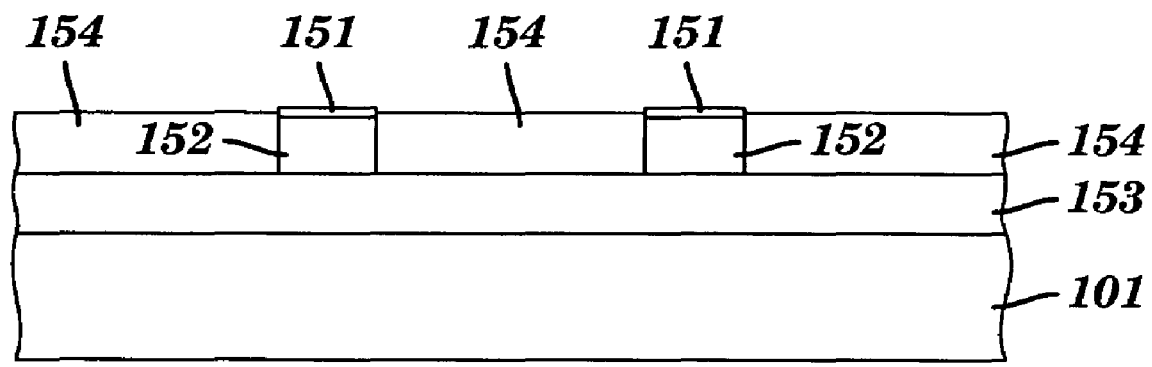
FIG. 6A illustrates a cross-section of an embodiment of the inventive fuse during the formation of the fuse.
Figure 6B:
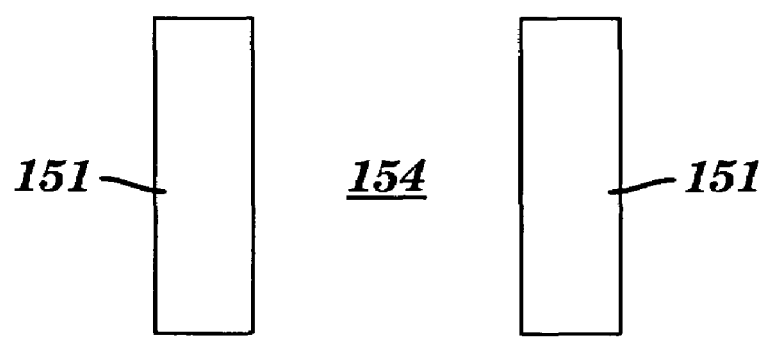
FIG. 6B illustrates a plan view of an embodiment of the inventive fuse during the formation of the fuse.

Preferably, the crystalline silicon 152 may be implanted with a dopant, such as boron or arsenic. In yet another alternate embodiment, one side of the crystalline silicon layer 152A may be implanted with boron, and the other side implanted with arsenic 152B, as illustrated in FIG. 5B. The crystalline silicon 152 may be doped with a P-type dopant or an N-type dopant, or may be doped to form a P-N junction. Optionally, a silicide layer 151 is formed atop the crystalline silicon layer 152, as illustrated in FIGS. 6A and 6B, using techniques known in the art, such as deposition of silicide (e.g. by a polycide process), or by deposition of a metal such as tungsten, cobalt, Ti or the like, followed by an anneal. The crystalline semiconductor layer 152 may remain undoped, in which case, the silicide layer 151 may be required to achieve the desired conductivity.

Figure 7A:
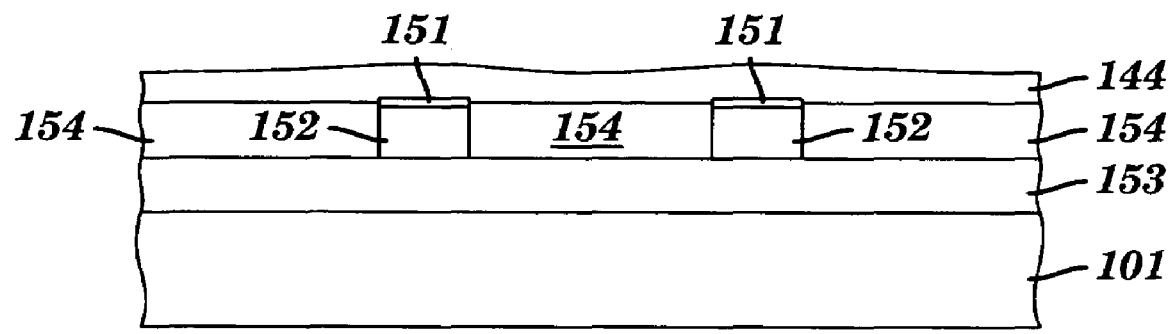
FIG. 7A illustrates a cross-section of an embodiment of the inventive fuse during the formation of the fuse.
Figure 7B:
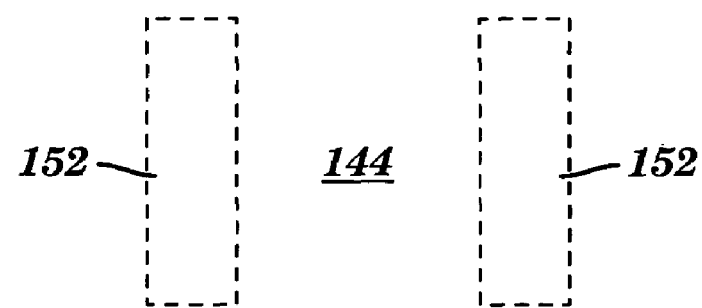
FIG. 7B illustrates a plan view of an embodiment of the inventive fuse during the formation of the fuse.
Figure 8A:
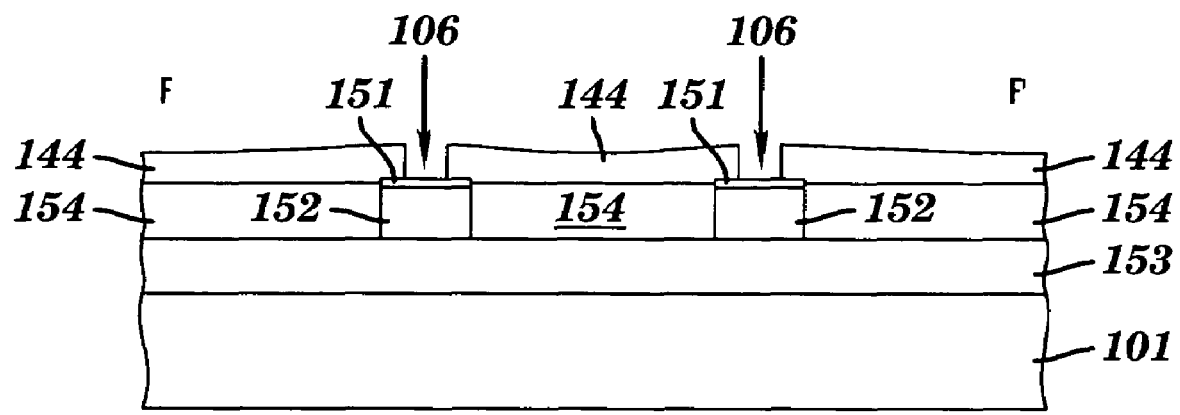
FIG. 8A illustrates a cross-section of an embodiment of the inventive fuse during the formation of the fuse.
Figure 8B:
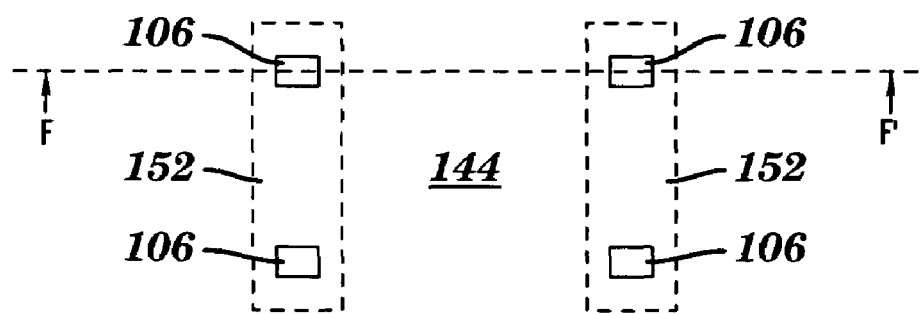
FIG. 8B illustrates a plan view of an embodiment of the inventive fuse during the formation of the fuse.

Next an encapsulating layer 144 is deposited over the entire structure as illustrated in FIGS. 7A and 7b. The encapsulating layer 144 may be formed from a suitable insulating material such as SiN or SiO$_2$ and more preferably SiN. This encapsulation 144 is further patterned to reveal contact holes 106 as illustrated in FIGS. 8A and 8B, that are subsequently filled with electrically conducting material such as tungsten to form contacts 45 (as illustrated in FIGS. 2A–2B).

Figure 9:
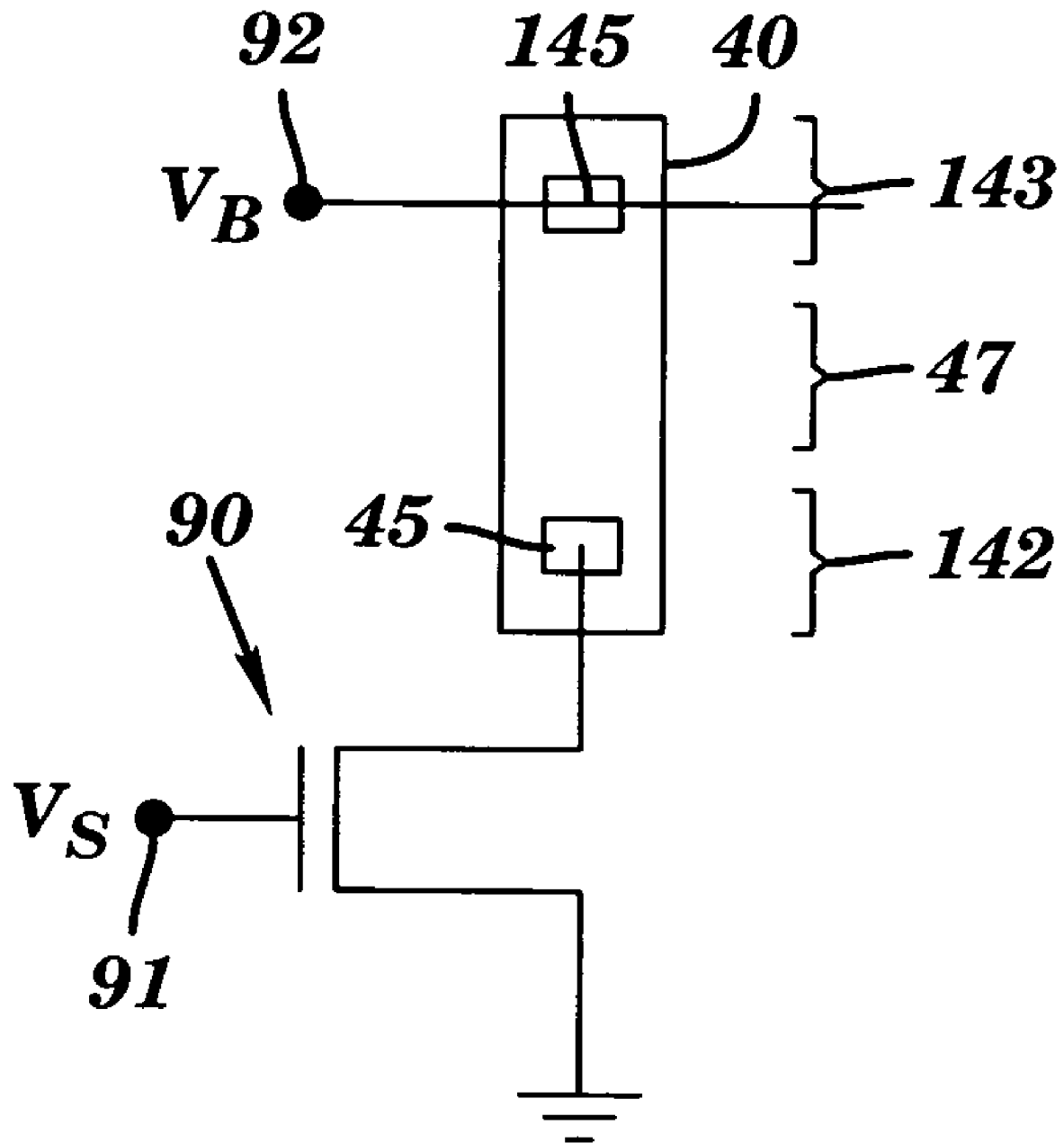
FIG. 9 illustrates programming of the inventive fuse.

FIG. 9 illustrates the programming of the eFUSE 40. The inventive eFUSE 40 is connected in series with a transistor 90 having a select terminal 91 through one of the contacts 45 on one of the contact regions 142. The other contact region 143 on the opposite end of the fuse link 47 is connected to a blow terminal 92 through the corresponding contact 145. A blow potential of $V_B$ is applied to the blow terminal 92. When a programming signal or pulse $V_S$ is applied to the select terminal 91, current will flow through the eFUSE 40. A typical $V_B$ is in the range of 1.5 to 3.3 V. A typical select or programming signal $V_S$ is a pulse with an amplitude about 1 volt to 2.5 volts, preferably about 1 volt, with a duration of about 50 microseconds to 50 milliseconds, preferably about 200 milliseconds. The inventive eFUSE 40 automatically maintains an appropriate temperature gradient for correct programming of the fuse, over such a wide range of programming voltages and programming times, and thus has a wide tolerance to programming voltage and times. The initial resistance of the fuse link 47 is less than about 200Ω and more typically about 100Ω. After programming, the final resistance is greater than about 1 MΩ.

Figure 10:
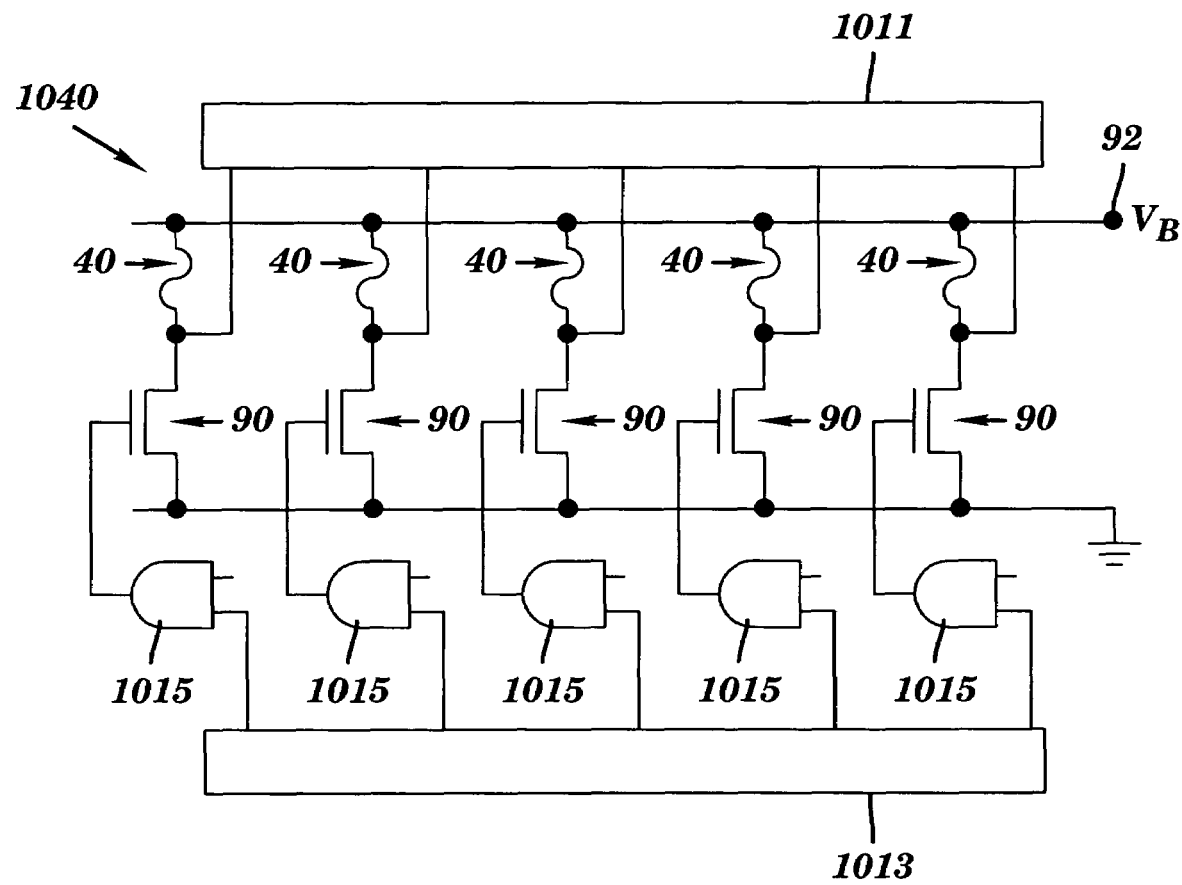
FIG. 10 illustrates a fuse bank in accordance with the present invention.

Referring to FIG. 10, the inventive eFUSE 40 may be used in a fuse bank 1040, which are used, for example, to permanently store information, as in a Permanent Read Only Memory (PROM). The eFUSEs 40 are coupled in parallel, each connected in series to its own associated select transistor 90. Each eFUSE 40 is also coupled to a common blow terminal 92 for applying the blow voltage $V_B$ in which serial latches 1013 are programmed with the pattern of fuses to be blown. Subsequent to applying the blow voltage $V_B$ to the blow terminal 92, appropriate digital control circuitry 1015 enables appropriate transistors 90, resulting in the programming of eFUSEs 40 corresponding to the pattern held in the serial latches 1013. Appropriate sense-circuitry (not shown) can be similarly integrated to read the information stored in the eFUSE bank 1040.

While the invention has been described in terms of specific embodiments, it is evident in view of the foregoing description that numerous alternatives, rearrangements, modifications, substitutions and variations will be apparent to those skilled in the art. Accordingly, the invention is intended to encompass all such alternatives, rearrangements, modifications, substitutions and variations which fall within the scope and spirit of the invention and the following claims.

What is claimed is:

1. An electrically programmable fuse comprising:
   a semiconductor substrate;
   an insulating layer on said semiconductor substrate;

a fuse body comprising a crystalline semiconductor body disposed on said insulating layer, so that said crystalline semiconductor body is electrically and thermally isolated from said semiconductor substrate, wherein sidewalls of said crystalline semiconductor body are substantially surrounded by a fill-in dielectric, wherein said fill-in dielectric does not substantially impose additional stress on said crystalline semiconductor body, and wherein a top surface of said fuse body and a top surface of said fill-in dielectric are substantially co-planar with each other;

a nitride capping layer disposed directly on said top surface of said fuse body and said top surface of said fill-in dielectric; and said fuse body comprising a fuse link region electrically connected to a first contact region at a first end of said fuse link region and a second contact region at the opposing end of said fuse link region.

2. The fuse of claim 1 wherein said crystalline body comprises a material selected from the group consisting of crystalline silicon, doped crystalline Si, crystalline SiGe, doped crystalline SiGe, crystalline GaAs, and doped crystalline GaAs.

3. The fuse of claim 1 wherein said insulating layer comprises a dielectric selected from the group consisting of oxide and nitride.

4. The fuse of claim 1 wherein said fuse link region comprises a layer of a silicide, a polycide or salicide.

5. The fuse of claim 1 wherein said fill-in dielectric comprises a material that minimizes outdiffusion of dopants from said crystalline semiconductor body.

6. The fuse of claim 1 wherein said insulating layer and said fill-in dielectric comprise an oxide.

7. The fuse of claim 1 wherein said fuse link has a width in the range about 0.03–0.3 µm.

8. The fuse of claim 1 wherein said fuse has a length in the range about 0.5–1.5 µm.

9. The fuse of claim 1 wherein said crystalline semiconductor body comprises a dopant selected from the group consisting of B, As, P and In.

10. The fuse of claim 1 wherein said crystalline semiconductor body comprises a first doped region and a second doped region comprising a different dopant than in said first doped region.

11. The fuse of claim 1 wherein said contact regions have the same width as said fuse link.

12. The fuse of claim 1 wherein said contact regions have widths that are wider than the width of said fuse link region.

13. An electrically programmable fuse comprising:

a semiconductor substrate;

an insulating layer on said semiconductor substrate;

a fuse body comprising a crystalline silicon body disposed on said insulating layer, so that said crystalline silicon body is electrically and thermally isolated from said semiconductor substrate, and said fuse body comprising a fuse link region electrically connected to a first contact region at a first end of said fuse link region and a second contact region at the opposing end of said fuse link region, wherein sidewalls of said crystalline silicon body are substantially surrounded by a fill-in oxide, and wherein a top surface of said fuse body and a top surface of said fill-in oxide are substantially co-planar with each other; and a nitride capping layer disposed directly on said top surface of said fuse body and said top surface of said fill-in oxide.

14. The fuse of claim 13 further comprising a silicide layer formed on said crystalline silicon body.

15. The fuse of claim 13 wherein said crystalline silicon body further comprises a dopant.

16. The fuse of claim 1 wherein said contact regions have widths that are equal to or wider than the width of said fuse link region.

* * * * *